(12) United States Patent
Zhu et al.

(10) Patent No.: US 8,754,503 B2
(45) Date of Patent: *Jun. 17, 2014

(54) SUBSTRATE STRIP PLATE STRUCTURE FOR SEMICONDUCTOR DEVICE AND METHOD FOR MANUFACTURING THE SAME

(75) Inventors: Huilong Zhu, Poughkeepsie, NY (US); Zhijiong Luo, Poughkeepsie, NY (US); Haizhou Yin, Poughkeepsie, NY (US)

(73) Assignee: Sunovel Suzhou Technologies Ltd., Suzhou (CN)

( * ) Notice: Subject to any disclaimer, the term of this patent is extended or adjusted under 35 U.S.C. 154(b) by 111 days.

This patent is subject to a terminal disclaimer.

(21) Appl. No.: 13/355,946

(22) Filed: Jan. 23, 2012

(65) Prior Publication Data
US 2012/0187543 A1  Jul. 26, 2012

Related U.S. Application Data (63) Continuation-in-part of application No. 13/264,063, filed as application No. PCT/CN2010/071770 on Apr. 14, 2010.

(60) Provisional application No. 61/212,673, filed on Apr. 15, 2009.

(30) Foreign Application Priority Data

Jan. 24, 2011 (CN) .......................... 2011 1 0025831
Jan. 18, 2012 (WO) ................ PCT/CN2012/070534

(51) Int. Cl.
H01L 23/52 (2006.01)
H01L 21/768 (2006.01)

(52) U.S. Cl.
USPC .......................................... 257/618; 438/666

(58) Field of Classification Search
USPC ........................................................ 257/684
See application file for complete search history.

Primary Examiner — Telly Green
Assistant Examiner — Damon Hillman
(74) Attorney, Agent, or Firm — Troutman Sanders LLP (57) ABSTRACT

The present invention provides a strip plate structure and a method for manufacturing the same. The strip plate structure comprises a strip plate array, which comprises a plurality of strip plates arranged with spacing in a predetermined direction on a same plane, wherein each of the strip plates has a first surface and a second surface opposite to the first surface and the strip plate array is arranged on a plane parallel to the first surface of the strip plates; a plurality of strip sheets which connect neighboring ones of the strip plates; flexible material layers, which are located on at least a portion of the surfaces of the strip sheets and/or on at least a portion of the surfaces of the strip plates.

19 Claims, 6 Drawing Sheets

SUBSTRATE STRIP PLATE STRUCTURE FOR SEMICONDUCTOR DEVICE AND METHOD FOR MANUFACTURING THE SAME

This application claims priority to U.S. application No. 61/212,673 filed on Apr. 15, 2009, U.S. application Ser. No. 13/264,063 filed on Oct. 12, 2011, Chinese patent application 201110025831.0 filed on Jan. 24, 2011, PCT application PCT/CN2012/070534 filed on Jan. 18, 2012. All of the U.S. applications, PCT patent application and Chinese patent application are incorporated herein by reference in their entireties.

FIELD OF THE INVENTION

The present invention relates to the field of semiconductor manufacturing, particularly, to a strip plate structure with an increased surface area for semiconductor device manufacturing and a method for manufacturing the same.

BACKGROUND OF THE INVENTION

In recent years, with rapid development in the semiconductor industry, development of semiconductor devices is oriented towards a trend of smaller dimension, higher circuit density, faster operation speed and lower power consumption; integrated circuits have entered a technical phase of submicron level nowadays. Therefore, in order to meet the demands of smaller dimension and higher density, requirements have been proposed in two aspects so far: on the one hand, it is required that the diameter of wafers should be gradually increased; silicon wafers with diameter of 300 mm have become the mainstream products by 2005, and it is predicted that silicon wafers with diameter of 450 mm (18 in) will come into use in 2012; the diameter of wafers is continuously expanded at a rate of about 1.5 times every 9 years, and wafers are evolved to have larger areas. On the other hand, another need also comes up, namely, it is desired to improve the utilization rate of surface areas of existing wafers without increasing dimensions of existing wafers, so as to increase surface areas thereof that can be processed.

Conventional materials like $SiO_2$, SiN exhibit significant brittleness during manufacturing of semiconductor devices. Therefore, when used to manufacture devices with thin film structure such as solar cells, the materials like $SiO_2$, SiN would rupture easily because of bending or stretching and then cause the connected device structure to break apart, which consequently destroys to the whole device structure or results in low yield or productivity of device manufacturing.

SUMMARY OF THE INVENTION

The present invention aims to at least overcome aforesaid technical defects, particularly, the problem that formerly connected device structure comprising a brittle thin film structure would break apart easily because of rupture happening to the thin film structure thereof under stretching.

In order to fulfill aforesaid aim, the present invention provides a strip plate structure, comprising: a strip plate array, which comprises a plurality of strip plates arranged with spacing in a predetermined direction on a same plane, wherein each of the strip plates has a first surface and a second surface opposite to the first surface and the strip plate array is arranged on a plane parallel to the first surfaces of the strip plates;

a plurality of strip sheets, which connect the neighboring strip plates;

flexible material layers, which are located on at least a portion of the surfaces of the strip sheets and/or on at least a portion of the surfaces of the strip plate.

According to one aspect of the present invention, the strip plates are perpendicular to the upright sidewalls of the strip sheets that connect the strip plates.

According to another aspect of the present invention, the material of the strip sheets is a material selected from a group consisting of: insulating materials, metals, semiconductor materials, polymers, or combinations thereof.

According to another aspect of the present invention, the material of the flexible material layers is a material selected from a group consisting of metals, polymers, nano materials or combinations thereof.

According to another aspect of the present invention, the metals include: Au, Al, Ag, Cu, Ti, or combinations thereof.

According to another aspect of the present invention, the polymers include: silica gel, polypropylene (PP), plexiglass, acrylic resin, acrylic acid, PMMA, polycast, transparent synthetic resin, resin glass, parylene, epoxy, polycarbonate (PC), silicone, polyurethane (PU), polyamide (PA), fluoropolymers, polyolefines (PE), collagen, chitin, chitosan, alginate fiber, polyvinyl pyrrolidone (PVP), PEG, PEO, PEO, PVA, PEG-PLA, PLA, PCL, poly amino acid, hydro gel, PDMS or combinations thereof: and the nano materials include nanotube, graphene or combinations thereof.

According to another aspect of the present invention, the thickness of to the flexible material layers is 0.1~100 μm, which is preferably 1~30 μm.

According to another aspect of the present invention, the strip plate structure further comprises interface layers formed at least on the first surfaces and/or the second surfaces of the strip plates.

According to another aspect of the present invention, the material of the strip plates is a material selected from a group consisting of: monocrystalline Si, monocrystalline Ge, monocrystalline SiGe, polycrystalline Si, polycrystalline Ge, polycrystalline SiGe, amorphous Si, amorphous Ge, amorphous SiGe, compound semiconductors of III-V or II-VI families, or combinations thereof.

According to another aspect of the present invention, the thickness of the strip sheet is less than ⅓ of the thickness of the strip plate which is the distance between the first surface and the second surface of one of the strip plates.

According to another aspect of the present invention, each of the strip sheets has a first surface and a second surface opposite to the first surface and the flexible material layers are located on the first surfaces and the second surfaces of the strip sheets.

According to another aspect of the present invention, at least a portion of the material of the strip sheets is the same as the material of the substrate.

Additionally, the present invention further provides a method for manufacturing a strip plate structure for semiconductor devices, which comprises following steps:

providing a substrate, which has a first surface and a second surface opposite to the first surface;

patterning the first surface and the second surface of the substrate;

forming at least two first trenches from the first surface of the substrate, and forming at least one second trench from the second surface of the substrate; wherein, each of the second trenches is located between two neighboring first trenches so as to form an upright strip plate array consisting of at least two strip plates and at least one strip sheet;

forming flexible material layers on at least a portion of surfaces of the strip sheets and/or on at least a portion of surfaces of the strip plates of the upright strip plate array; and stretching the upright strip plate array to form a substantially planar strip plate array.

According to another aspect of the present invention, a device is formed on the strip plates between the step c) and d) or after the step e).

According to another aspect of the present invention, at least a portion of the material of the strip sheets is the same as the material of the substrate.

According to another aspect of the present invention, the flexible material layers at the step d) are formed by means of spraying, CVD, PVD, ALD, evaporating, spin coating, or combinations thereof.

According to another aspect of the present invention, the material of the flexible material layers is a material selected from a group consisting of metals, to polymers, nano materials or combinations thereof.

According to another aspect of the present invention, the metals include: Au, Al, Ag, Cu, Ti, or combinations thereof.

According to another aspect of the present invention, the polymers include: silica gel, polypropylene (PP), plexiglass, acrylic resin, acrylic acid, PMMA, polycast, transparent synthetic resin, resin glass, parylene, epoxy, polycarbonate (PC), silicone, polyurethane (PU), polyamide (PA), fluoropolymers, polyolefines (PE), collagen, chitin, chitosan, alginate fiber, polyvinyl pyrrolidone (PVP), PEG, PEO, PEO, PVA, PEG-PLA, PLA, PCL, poly amino acid, hydro gel, PDMS or combinations thereof; and the nano materials include nanotube, graphene or combinations thereof.

According to another aspect of the present invention, the thickness of the flexible material layers is 0.1~100 µm, which is preferably 1~30 µm.

According to another aspect of the present invention, the stretching step at the step e) comprises: stretching the upright strip plate array along the predetermined direction, such that the strip sheets connecting the neighboring strip plates are bent into arch shapes; the strip plate has a first surface and a second surface opposite to the first surface thereof, and the first surfaces and the second surfaces of the strip plates are perpendicular to the upright sidewalls of the arched strip sheets; the first surfaces and the second surfaces of the plurality of strip plates are located on two planes parallel to each other, respectively.

According to another aspect of the present invention, the stretching step at the step e) is operated at a temperature of 0° C.~300° C.

According to another aspect of the present invention, the stretching step at the step e) is operated at a temperature of 10° C.~90° C.

According to another aspect of the present invention, at the step e), the neighboring bent strip sheets are bent towards opposite directions; the strip sheets are bent to form arched grooves.

According to another aspect of the present invention, the arched grooves formed by the bent strip sheets contain the flexible material.

According to another aspect of the present invention, a step of removing the flexible material further comes after the step e).

According to another aspect of the present invention, the step a) further comprises: forming strip sheet layers on the upper surface and the lower surface of the substrate.

According to another aspect of the present invention, wherein following step further comes between the steps c) and d) or after the step d): separating the upright strip plate array from the substrate.

According to another aspect of the present invention, the material of the strip sheets is a material selected from a group consisting of: insulating layers, metal layers, polymers, semiconductor materials and combinations thereof.

According to another aspect of the present invention, wherein the step for forming the first trenches and the second trenches at the step c) comprises: etching a plurality of first trenches from the first surface of the substrate, which is stopped on the strip sheet layer at the second surface thereof; and etching a plurality of second trenches from the second surface of the substrate, which is stopped on the strip sheet layer at the first surface thereof.

According to another aspect of the present invention, wherein the step b) comprises:

forming photoresist with a plurality of openings on the strip sheet layer at the first surface;

etching the strip sheet layer to remove the strip sheet layer at the plurality of openings on the first surface;

removing the photoresist;

forming photoresist with a plurality of openings on the strip sheet layer at the second surface;

etching the strip sheet layer to remove the strip sheet layer at the plurality of openings on the second surface; and removing the photoresist.

According to another aspect of the present invention, wherein the method for forming the first trenches and the second trenches at the step c) includes dry etching, wet etching or a combination thereof.

According to another aspect of the present invention, wherein the step c) further comprises a step of forming interface layers at least on sidewalls of the first trenches and/or the second trenches.

According to another aspect of the present invention, wherein the depth of at least one of the first trenches and the second trenches is at least greater than the sum of the thickness of the strip plates and the spacing between the neighboring strip plates.

According to another aspect of the present invention, wherein the thickness of the strip sheet is less than ⅓ of the thickness of the strip plate.

The present invention makes effective use of the thickness of the substrate, and increases processable surface areas or the utilization rate of surface areas of wafers, on the premise that dimensions of whole wafers are not increased. The present invention proposes to form flexible material layers on surfaces of the strip sheets, therefore, when the upright strip plate array is stretched to form a substantially planar strip plate array with a plurality of connected strip plates, the neighboring strip plates can still be connected through the flexible material layers, even if the strip sheets go ruptured because of their brittleness; therefore, according to the present invention, it becomes quite easy to stretch a plurality of strip plates into a substantially planar array where the strip plates are distributed on a same plane, and to improve efficiency and yield of device structure manufacturing.

Additional aspects and advantages of the invention will be set forth in part in the description which follows and, in part, will be obvious from the description, or may be learned by practice of the invention.

BRIEF DESCRIPTION OF THE DRAWINGS

The above and/or additional aspects and advantages of the present invention will become apparent and better understood through the description of the embodiments below in conjunction with the drawings, in which.

DETAILED DESCRIPTION OF THE INVENTION

Embodiments of the present invention are described in detail here below, wherein examples of the embodiments are illustrated in the drawings, in which same or similar reference signs throughout denote same or similar elements or elements have same or similar functions. It should be appreciated that the embodiments described below in conjunction with the drawings are illustrative and are provided for explaining the prevent invention only, thus shall not be interpreted as limitations to the present invention. Various embodiments or examples are provided here below to implement different structures of the present invention. To simplify the disclosure of the present invention, description of components and arrangements of specific examples is given below. Of course, they are illustrative only and not limiting the present invention. Moreover, in the present invention, reference numbers and/or letters may be repeated in different embodiments. Such repetition is for purposes of simplification and clarity, yet does not denote any relationship between respective embodiments and/or arrangements being discussed. Furthermore, the present invention provides various examples for various process and materials. However, it is obvious for a person of ordinary skill in the art that other processes and/or materials may alternatively be utilized. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

The present invention makes effective use of thickness of substrates, and increases processable surface areas or the utilization rate of surface areas of wafers, on the premise that dimensions of whole wafers are not increased. The present invention proposes to form flexible material layers on surfaces of the strip sheets, therefore, when the upright strip plate array is stretched to form a substantially planar strip plate array with a plurality of connected strip plates, the neighboring strip plates can still be connected through the flexible material layers, even if the strip sheets go ruptured because of their brittleness; therefore, according to the present invention, it becomes quite easy to stretch a plurality of strip plates into a substantially planar array where the strip plates are distributed on a same plane, and to improve efficiency and yield of device structure manufacturing.

Figure 13:
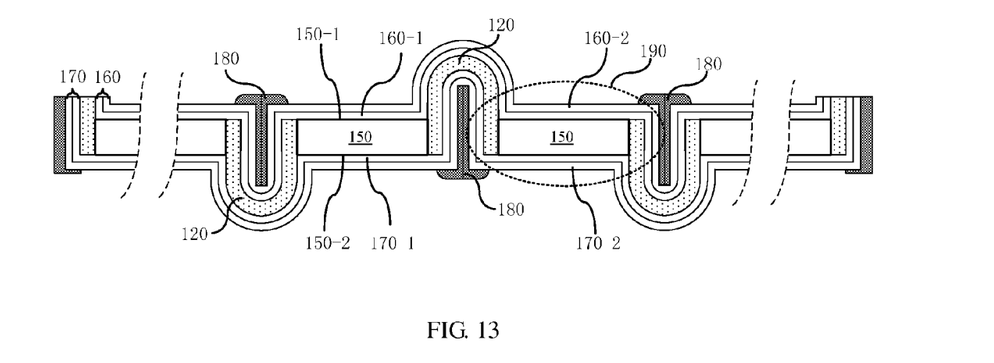

The present invention provides a strip plate structure as shown in FIG. 13, comprising: a strip plate array, which comprises a plurality of strip plates 150 arranged with spacing along a predetermined direction on a same plane, wherein each of the strip plates 150 has a first surface 150-1 and a second surface 150-2 opposite to the first surface, and the strip plate array is arranged on a plane parallel to the first surfaces of the strip plates; a plurality of strip sheets 120, which connect neighboring ones of the strip plates 150, wherein the strip plates 150 are perpendicular to the upright sidewalls of the strip sheets 120 that connect the strip plates and each of the strip sheet 120 has a first surface and a second surface opposite to the first surface, wherein the first surface of the strip sheet is the concave surface of the arch formed by the bent strip sheet shown in FIG. 13, and the second surface of the strip sheet is the convex surface of the arch formed thereby; flexible material layers 180, which are located on the first surfaces of the strip sheets 120 and/or at least a portion of the surfaces of the strip plates 150, wherein the flexible material layers 180 also may be located on the first surfaces and the second surfaces of the strip sheets 120, so as to increase strength and anti-stretch performance of the strip sheets. The material of the strip sheets 120 is a material selected from a group consisting of: insulating materials, metals, semiconductor materials, polymers or combinations thereof. The material of the flexible material layers 180 is a material selected from a group consisting of metals, polymers, nano materials or combinations thereof. The metals may include: Au, Al, Ag, Cu, Ti or combinations thereof; the polymers may include: silica gel, polypropylene (PP), plexiglass, acrylic resin, acrylic acid, PMMA, polycast, transparent synthetic resin, resin glass, parylene, epoxy, polycarbonate (PC), silicone, polyurethane (PU), polyamide (PA), fluoropolymers, polyolefines (PE), collagen, chitin, chitosan, alginate fiber, polyvinyl pyrrolidone (PVP), PEG, PEO, PEO, PVA, PEG-PLA, PLA, PCL, poly amino acid, hydro gel. PDMS or combinations thereof; and the nano materials may include nanotube, graphene or combinations thereof.

The thickness of the flexible material layers 180 is 0.1~100 μm, which is preferably 1~30 μm. The strip plate structure further comprises interface layers 160 formed at least on the first surfaces 150-1 and/or the second surfaces 150-2 of the strip plates 150. The material of the strip plates is a material selected from a group consisting of: monocrystalline Si, monocrystalline Ge, monocrystalline SiGe, polycrystalline Si, polycrystalline Ge, polycrystalline SiGe, amorphous Si, amorphous Ge, amorphous SiGe, compound semiconductors of III-V or II-VI families, or combinations thereof. The thickness of the strip sheets is less than ⅓ of the thickness of the strip plates, which is the distance from the first surface to the second surface of one strip plate. In one case, at least a portion of the material of the strip sheets 120 may be same as that for the strip plates 150, for example, both are silicon.

Figure 1:
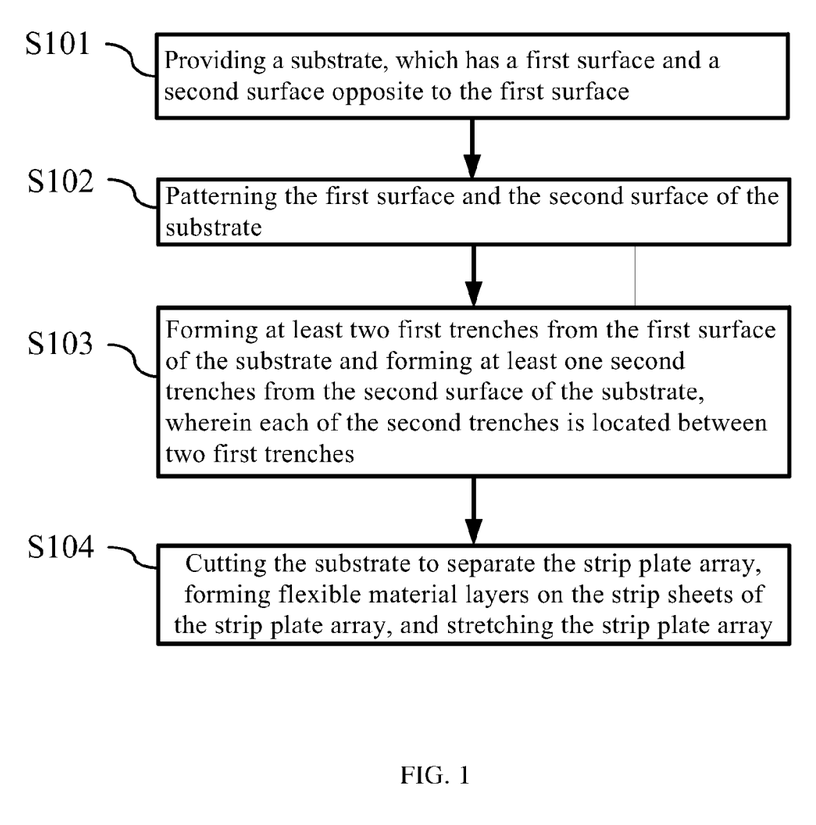
FIG. 1 illustrates a flowchart of a method for manufacturing a strip plate structure according to an embodiment of the present invention.

FIG. 1 illustrates a flowchart of a method for forming a strip plate structure shown in FIG. 13 according to an embodiment of the present invention, which comprises following steps.

Figure 2:
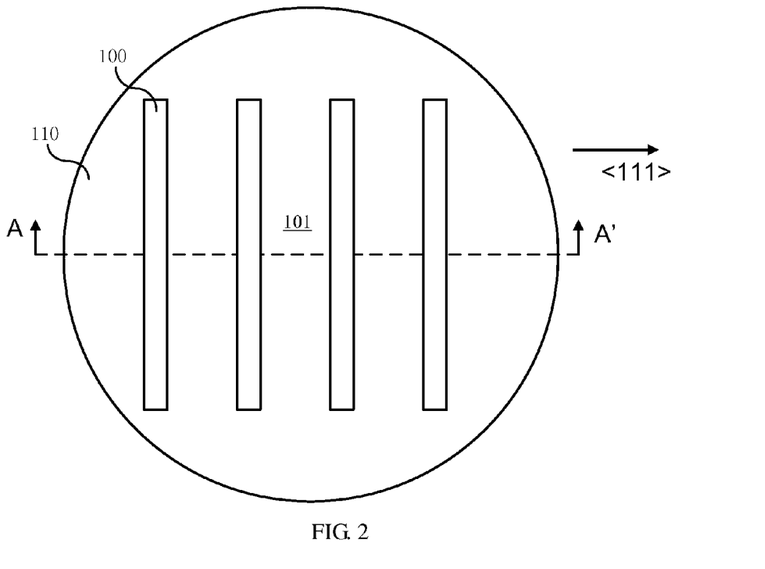
FIG. 2 illustrates a plan view at a beginning stage of manufacturing a strip plate structure according to an embodiment of the present invention.

At step S101, a wafer or a substrate 101 is provided, as shown in FIG. 2. In an embodiment of the present invention, the substrate 101 is a semiconductor substrate, for example, Si, Ge and a compound semiconductor or a combination thereof, which includes, but is not limited to, monocrystalline Si, monocrystalline Ge and monocrystalline SiGe. Preferably, the crystal orientation of the surfaces 101-1 and 101-2 is {110} or {112}. The substrate 101 also may comprise one or more materials selected from a group consisting of polycrystalline Si, polycrystalline Ge, polycrystalline SiGe, amorphous Si, amorphous Ge, amorphous SiGe, compound semiconductors of III-V and II-VI families, or combinations thereof. In other embodiments, the substrate may be formed through various methods, for example, deposition, epitaxial growth or the like; the substrate may have N-type doping configuration or P-type doping configuration. The thickness of the substrate may be, for example, 0.1-2 mm, which of course is not limited to that range in the present invention. The substrate comprises a first surface 101-1 and a second surface 101-2 opposite to the first surface thereof, as shown in FIG. 3.

Specifically, strip sheet layers 100 are formed on the first and second surfaces of the substrate; wherein the strip sheet layers 100 may be in a single layer or multi-layer structure, and the materials for each layer and the thicknesses thereof may be configured as needed in practice. For example, the strip sheet layer may include an insulating layer that covers the upper and lower surfaces of the substrate and functions as an etch mask layer, and shall satisfy design requirements of different etching methods or types of etching solutions and depths of structures to be etched. Materials for the strip sheet layers and the thicknesses of the strip sheet layers shall be selected appropriately at step S101. For example, if wet etching is applied, the material of the strip sheet layers 100 is preferably a material selected from a group consisting of $SiO_2$, SiN or combinations thereof. If reaction ion etching is used to form the structure, the material of the strip sheet layers may be a material selected from a group consisting of $SiO_2$, SiN or combinations thereof, alternatively, may be a flexible polymer like parylene. Of course, according to needs in practice, the material of the strip sheet layers 100 also may be a material selected from a group consisting of metals, semiconductor materials, other insulating materials, or combinations thereof.

Figure 3:
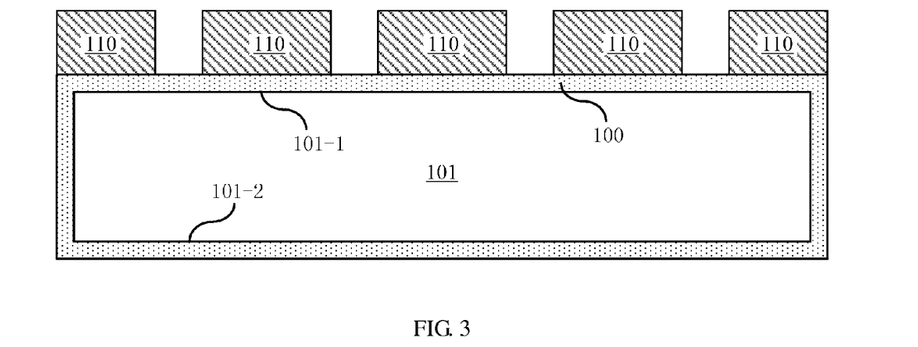
FIG. 3-FIG. 14 illustrate cross-sectional views along A-A' direction at respective stages of manufacturing a strip plate structure according to an embodiment of the present invention.
Figure 4:
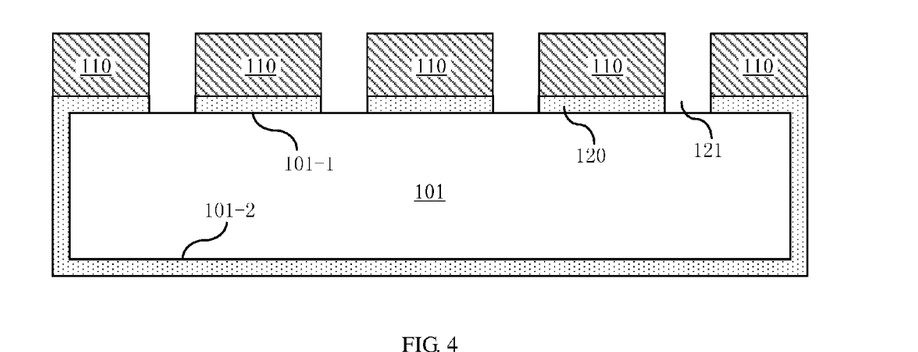
Figure 5:
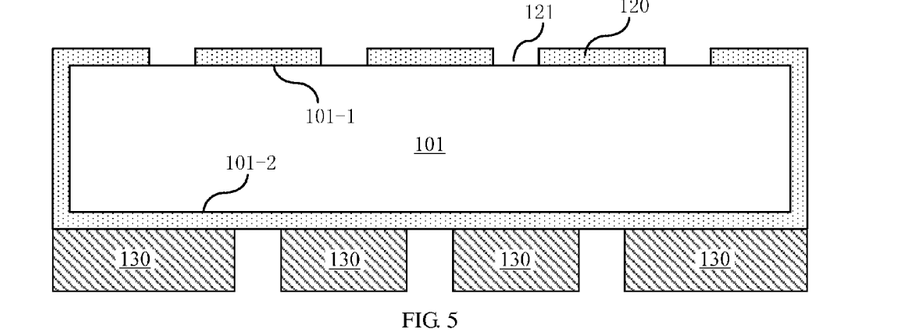
Figure 6:
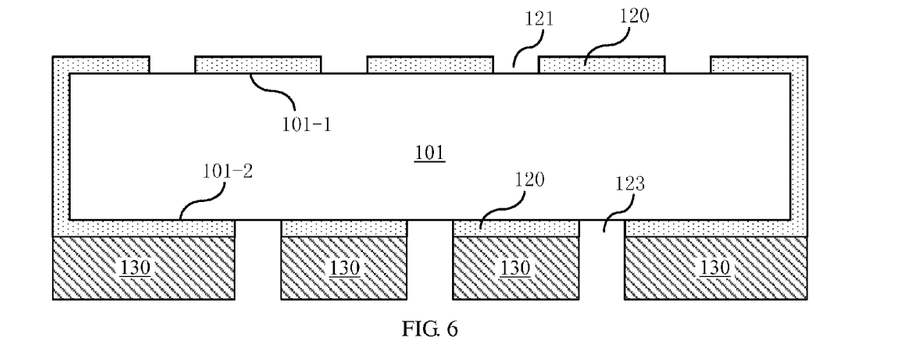

At step S102, the first surface 101-1 and the second surface 101-2 of the substrate are patterned, as shown in FIG. 2-FIG. 6. Specifically, after formation of strip sheet layers 100 on the first surface and the second surface of the substrate, photoresist 110 with a plurality of openings configured in predetermined spacing is formed on the first surface 101-1 of the substrate 101, thus the strip sheet layer 100 is exposed through the openings, as shown in FIG. 3. Preferably, in case the substrate is made of a monocrystalline material, the crystal orientation perpendicular to the direction of the opening length is <111>. The strip sheet layer 100 is etched with photoresist 110 functioning as mask till the first surface 101-1 of the substrate is exposed, so as to form a plurality of first openings 121 and a plurality of patterned strip sheets 120 on the strip sheet layer 100, as shown in FIG. 4. After the photoresist 110 is removed, photoresist 130 with a plurality of openings configured in predetermined spacing is formed on the second surface 101-2, as shown in FIG. 5. The strip sheet layer 100 on the second surface of the substrate is etched with the photoresist 130 functioning as mask till the second surface 101-2 of the substrate is exposed, so as to form a plurality of second openings 123 and patterned strip sheets 120 on the strip sheet layer 100, as shown in FIG. 6. Finally, the photoresist 130 on the second surface is removed. As a preferred embodiment of the present invention, the spacing between neighboring first openings 121 is equal to the spacing between neighboring second openings 123. The first openings 121 and the second openings 123 are arranged alternatively. Of course, aforesaid step for forming patterns is exemplary only; a person of ordinary skill in the art may obtain the patterned substrate given in the embodiment through many methods widely known in the art, which also may be applied in the embodiment without departing from the spirit and scope of the present invention. For example, forgoing steps for forming photoresist on two surfaces of the substrate 101 and performing etching process twice also may be combined into one step, namely, forming photoresist on two surfaces concurrently, implementing patterning, lithography and removing photoresist concurrently.

Figure 7:
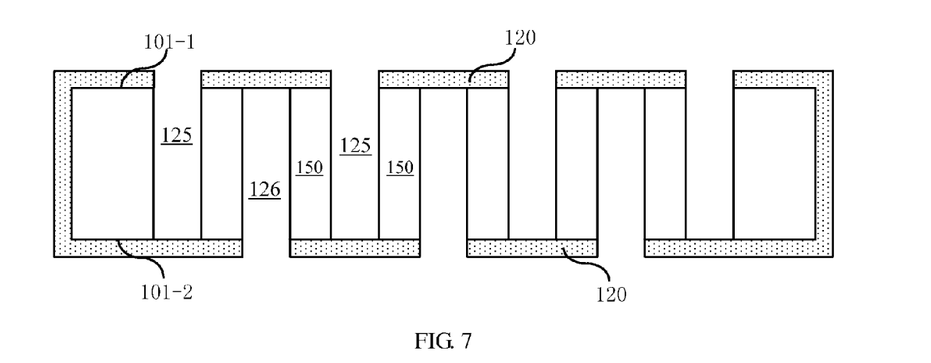

Next, at step S103, as the strip sheets 120 function as mask, the substrate is etched from the first opening 121 on the first surface 101-1 and the to second opening 123 on the second surface 101-2 to form at least two first trenches 125 and at least one second trench 126, as shown in FIG. 7. The openings of the first trenches 125 and the second trenches 126 face opposite directions. Herein, the sidewalls of the first trench 125 are referred to as the first surfaces of the strip plates, and the second trenches 126 are referred to as the second surfaces of the strip plates. Optionally, the substrate 101 may be etched completely or partly; for example, the first surface 101-1 of the substrate may be etched, which is stopped on the strip sheet layer 120 at the second surface, and the second surface 101-2 of the substrate is etched, which is stopped on the strip sheet layer 120 at the first surface 101-1. Of course, it is also applicable to etch part of the substrate material, namely, the bottoms of the first trenches and the second trenches do not reach the strip sheet layers 120 on the second surface and the first surface of the substrate. The substrate 101 between the first trench 125 and the second trench 126 neighboring to the first trench forms a strip plate 150. The width of the strip plate 150 is the same as the thickness of the substrate 101, which is about 0.1-2 mm; the thickness of the strip plate 150 is the distance between the neighboring trenches 125 and 126, which is about 5-120 μm. The first trench and the second trench may have equal or unequal spacing; specifically, the substrate may be patterned so as to make the first trench and the second trench substantially parallel, and this may be configured according to design needs. As such, each of the second trenches 126 is located between two neighboring first trenches 125, so as to segment the substrate into at least two strip plates 150 and at least one strip sheet 120. The strip plate 150 is defined by a sidewall of the first trench 125 and a sidewall of the second trench 126, and the strip sheet 120 connects the two neighboring strip plates 150. FIG. 7 illustrates a cross-sectional view along A-A' direction of the diagram of the substrate illustrated in FIG. 2. As shown in FIG. 7, the formed strip plate structure comprises a plurality of strip plates 150 arranged uprightly, which herein is referred to as an upright strip plate array.

It should be appreciated that the substrate also may be etched directly using photoresist as mask at step S102, if no strip sheet layer 100 is formed at step S101; the upright strip plate array structure of the present invention also can be obtained as long as the substrate is not etched through by way of controlling etching depth, so as to achieve the aim of the present invention. In case the substrate is not etched through, the portion from the substrate at the bottom of the recess formed from etching to the other side of the substrate is regarded as the strip sheet of the present invention, while the substrate between the neighboring recesses is regarded as the strip plate of the present invention. In this case, both the strip sheet and the strip plate are part of the substrate, thus their materials are same as that for the substrate.

Preferably, the thickness of the strip sheets 100 is less than ⅓ of the thickness of the strip plate, which is the distance from the first surface to the second surface of one strip plate, or the distance between the surfaces that make up the sidewalls of two neighboring trenches.

Preferably, the depth of one of the first trench 125 and the second trench 126 is greater than the sum of the thickness of the strip plate and the spacing between neighboring strip plates (i.e. the width of the first trench 125 or the second trench 126), which therefore is able to effectively utilize the thickness of the substrate to increase effective surface area, wherein the increased area is relative to the depth-to-width ratio of trenches, namely, the greater the depth-to-width ratio is the larger the area is increased. In a case, it is supposed that the thicknesses of strip plates are the same and are equal to the width of all trenches, and widths of the strip plates are the same and are equal to the depth of all trenches, if the depth-to-width ratio of trenches is n, then the effective surface area of the strip plate structure provided by the present invention is about n/2 times of the surface area of the initial substrate. When the depth-to-width ratio of trenches is 10 or above, the increase of the effective area will become considerably evident, and this is able to effectively reduce manufacturing cost of devices like solar cells that require semiconductor materials with large area.

Depending on the property of the material of the substrate, a person of ordinary skill in the art can select an appropriate method for forming the first trench 125 and the second trench 126 without departing from the spirit and scope of the present invention. For instance, the first trenches and the second trenches may be formed by means of anisotropic etching, such as reactive ion etching (RIE), deep reactive ion etching (DRIE), dry etching, wet etching, or combinations thereof. Specifically, when the substrate is formed with a monocrystalline material, such as monocrystalline Si, monocrystalline Ge, monocrystalline SiGe or a combination thereof, wet etching may be adopted with an etching solution like potassium hydroxide (KOH), tetramethylammonium hydroxide (TMAH) or ethylenediamine-pyrocatechol (EDP); under the circumstance that the crystal orientation of the first surface and the second surface is {110} or {112}, the crystal orientation of the surfaces corresponding to the sidewalls of the formed first and second trenches will be {111}. Since the distance between the first trench 125 and the second trench 126 determines the thickness of the strip plate structure 150, therefore, lithography is adopted to control the thickness of the strip plate structure 150 in the method.

Figure 8:
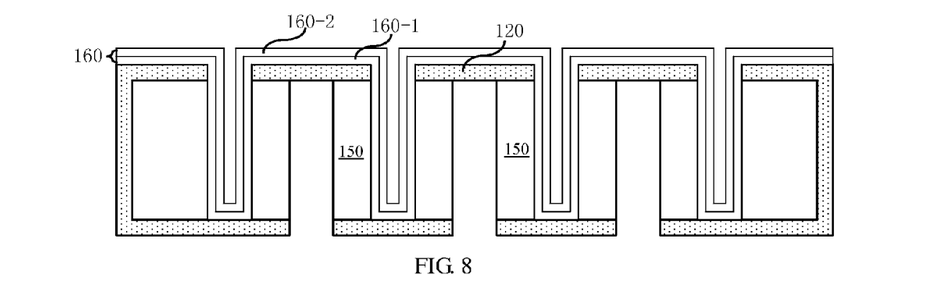

Specifically, at step S103, a device structure may be formed on sidewalls of the first trenches 125 after formation of the first trenches 125 and the second trenches 126 as shown in FIG. 7. For example, an interface layer 160 is formed at least on sidewalls of the first trench 125 (i.e. the first surface of the strip plate), as shown in FIG. 8. The interface layer 160 may be in a multi-layer structure. In an embodiment of the present invention, the interface layer 160 may be in a multi-layer structure and comprises a first semiconductor layer 160-1 and a first electrode layer 160-2; the first semiconductor layer has a doping type different from that of the substrate, namely, if the substrate is P-type doped, the first semiconductor layer is N-type doped; if the substrate is N-type doped, then first semiconductor layer is P-type doped. The first semiconductor layer 160-1 may be formed by means of dopant ion diffusion or deposition and also may be further diffused later; in the present embodiment, the first semiconductor layer 160-1 may be formed with a material selected from a group consisting of amorphous Si (a-Si), poly-Si, monocrystalline Si, or combinations thereof. In one embodiment, the interface layer 160 also may be formed to cover the first trenches 125 completely. In another embodiment, the interface layer 160 may be formed only on the sidewalls of the first trenches 125. The selective formation of interface layer 160 may be done by selective epitaxial deposition. For example, when the strip plate 150 is made of Si, SiGe or combination thereof and the strip sheet 120 is made of silicon dioxide or silicon nitride, Si deposition can be selectively formed on the sidewalls of the strip plate 150, not on the strip sheet 120, by selective epitaxial deposition.

After formation of the first semiconductor layer 160-1, the first electrode layer 160-2 is formed thereon. As a preferred embodiment of the present invention, a transparent conductive oxide is deposited to form the first electrode layer 160-2. As a preferred embodiment of the present invention, the temperature is controlled below 550° C. at deposition. As a preferred embodiment of the present invention, transparent conductive oxide (TCO) is $SnO_2$ and ZnO; in other embodiments, TCO further may be $In_2O_3$, ITO, CdO, $Cd_2SnO_4$, FTO, AZO or combinations thereof.

Figure 9:
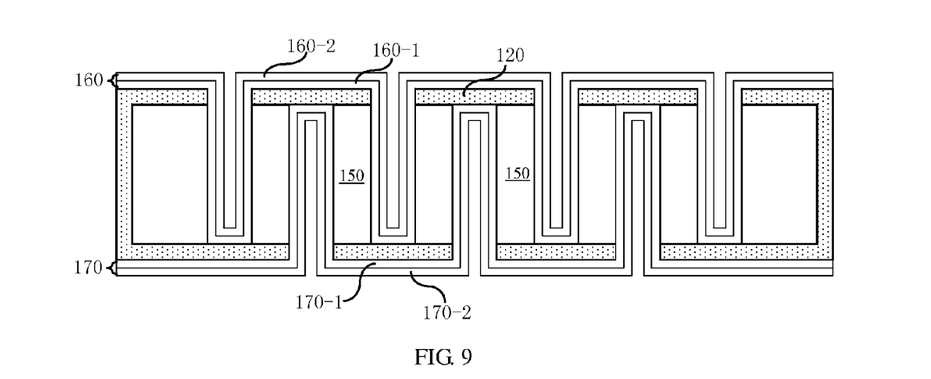

Similarly, a device structure also may be formed on sidewalls of the second trench 126, after formation of the strip plate structure as shown in FIG. 7. For example, another interface layer 170 is formed at least on sidewalls of the second trenches 126 (i.e. the second surface of the strip plates), as shown in FIG. 9. The interface layer 170 may be in a single layer or multi-layer structure. In an embodiment of the present invention, the interface layer 170 is a multi-layer structure and comprises a second semiconductor layer 170-1, which has same doping type as that of the substrate, and a second electrode layer 170-2; the second semiconductor layer 170-1 may be formed by means of dopant ion diffusion or deposition and also may be further diffused later. In the present embodiment, the second semiconductor layer 170-1 may be amorphous Si (a-Si), poly-Si, monocrystalline Si or a combination thereof. In one embodiment, the interface layer 170 also may be formed to cover the second trenches 126 completely. In another embodiment, the interface layer 170 may be selectively formed on the sidewalls of the second trenches 126.

After formation of the second semiconductor layer 170-1, the second electrode layer 170-2 is formed thereon. Similarly, the second electrode layer 170-2 may be formed of any conductive materials, such as metallic materials; as a preferred embodiment of the present invention, a Transparent Conductive Oxide (TCO) is deposited to form the second electrode layer 170-2. As a preferred embodiment of the present invention, the temperature is controlled below 550° C. during deposition. As a preferred embodiment of the present invention, TCO may be $SnO_2$ and ZnO; in the other embodiments, TCO also may be $In_2O_3$, ITO, CdO, $Cd_2SnO_4$, FTO, AZO or a combination thereof.

At step S104, the substrate 101 is cut so as to cut the upright strip plate array off from the substrate. Flexible material layers 180 are formed on the strip sheets 120 at the substrate, and the substrate 101 is stretched to form a strip plate array, which are specifically shown in FIG. 10~FIG. 14.

Figure 10:
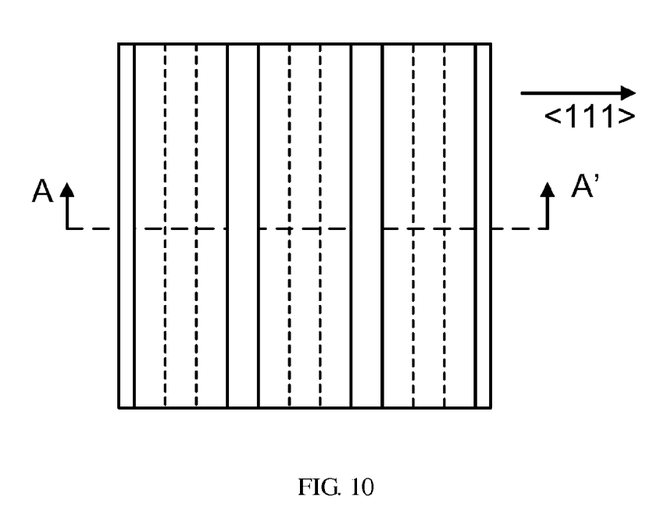
Figure 11:
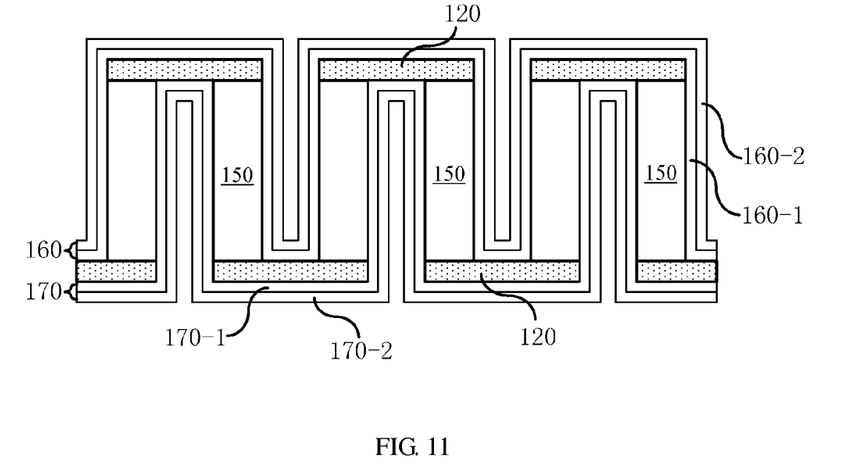

At first, peripheral area of the substrate wafer is cut off by means of laser beam or other cutting tools, as shown in FIG. 10. FIG. 11 illustrates a cross-sectional view of an upright strip plate array of an embodiment of the present after the peripheral area of the substrate wafer has been cut off.

Figure 12:
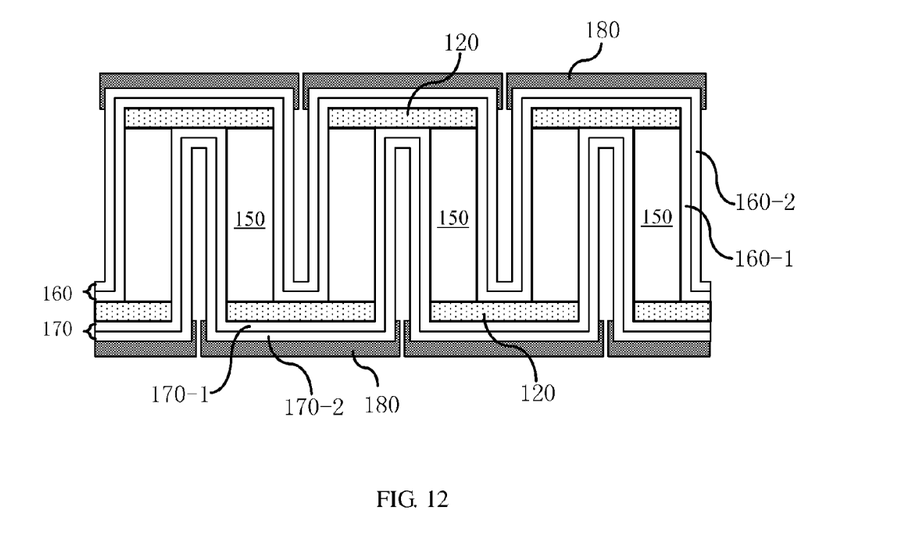

After the substrate 101 is cut, flexible material layers 180 are formed respectively on strip sheets at the first surface and the second surface of the substrate, as shown in FIG. 12. The flexible material layers may be formed by means of spraying, CVD, PVD, ALD, evaporating, spin coating or combinations thereof. The thickness of the flexible material layers is 1~30 μm, and the material thereof may be a material selected from a group consisting of metals, polymers, nano materials, or combinations thereof; wherein, the metals may include Au, Al, Ag, Cu, Ti or combinations thereof; the polymers may include silica gel, polypropylene (PP), plexiglass, acrylic resin, acrylic acid, PMMA, polycast, transparent synthetic resin, resin glass, parylene, epoxy, polycarbonate (PC), silicone, polyurethane (PU), polyamide (PA), fluoropolymers, polyolefins (PE), collagen, chitin, chitosan, alginate fiber, polyvinyl pyrrolidone (PVP), PEG, PEO, PEO, PVA, PEG-PLA, PLA, PCL, poly amino acid, hydro gel, PDMS or combinations thereof; and the nano materials may include nano-tube, graphene or combinations thereof. The selected flexible material should exhibit certain flexibility, ductility and adhesion. The shape and appearance of the flexible material layer may be controlled by way of controlling parameters of spraying process, such that the flexible material layers 180 are formed on the first surface and the second surface of the substrate; therefore, the aim of the present invention can be fulfilled even if part of the flexible material comes into the trenches. Preferably, the flexible material does not enclose the openings of the trenches. In another embodiment, the flexible material may come into the trenches and cover the boundaries of the strip sheets and the strip plates (as shown in FIG. 12), or even may cover the whole surface of strip plates, as long as it does not affect the operation of stretching and flattening the strip plates in the subsequent process. One advantage of covering the boundaries of strip plates and strip sheets is to avoid the strip plates separating from the strip sheets at their boundaries during the subsequent process of stretching and flattening the strip plates.

In another embodiment, the flexible material may cover at least a portion of the surfaces at the bottoms of the trenches (i.e. the second surfaces of the strip sheets). One of the advantages of covering the first surface and the second surface of the strip sheets, which face each other, with a flexible material layer is that it can reduce likelihood of rupture of the strip sheets at subsequent process of stretching and flattening the strip plates.

The orders of aforesaid step of cutting the substrate and the step of applying the flexible material layers may be exchanged, namely, the flexible to material layers are applied first, while the peripheral area of the substrate wafer is cut then.

Then, the whole strip plate structure is stretched evenly from two ends of the upright strip plate array, such that the first trenches and the second trenches are stretched apart to form a substantially planar strip plate array. FIG. 13 illustrates a diagram of the substantially planar strip plate array formed after stretching. The plurality of strip plates 150 turn substantially 90°, and the strip sheets are bent into arch shapes to connect the neighboring strip plates; the plurality of strip plates are perpendicular to the upright sidewalls of the arched strip sheets, wherein curvatures of the neighboring strip sheets 120 are opposite to each other. The temperature for stretching the substrate is 0° C.~300° C., which is preferably 10° C.~90° C.; in aforesaid temperature range, the flexible material layers 180 are softened and fill into the arched grooves formed after the strip sheets are bent, along with the strip sheets 120 going bent. If no flexible material layer is provided, and the strip sheets 120 are made of a brittle material like $SiO_2$, SiN, rupture would easily happen during stretch operation, consequently, the upright strip plate array would sometimes break apart at the strip sheets before it is stretched into a substantially planar strip plate array. Therefore, difficulty of stretch operation increases when there are many strip plates and the size of the strip plates is small. Using the flexible material layers to reinforce the connection of the neighboring strip plates helps avoid the strip plates breaking apart when the strip sheets rupture under stretching, therefore, to the plurality of strip plates can be stretched into a substantially planar strip plate array where the strip plates are connected on a same plane, during the stretching process. Efficiency and yield of device manufacturing are improved accordingly.

Additionally, when a flexible polymer like parylene is used to make strip sheets 120, it would not rupture easily during stretching process owing to its flexibility, thus it can further increase flexibility of the strip sheets in conjunction with the flexible material layers 180; meanwhile, because the plurality of strip plates are stretched into a substantially planar strip plate array where the strip plates are connected on a same plane, therefore, efficiency and yield of device manufacturing can be improved as well.

Figure 14:
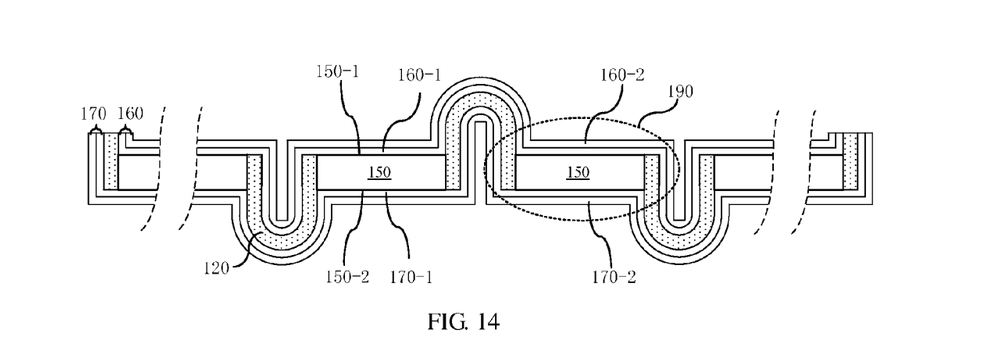

Then, the device is processed subsequently. For example, the operation of forming a device on sidewalls of the first trenches and the second trenches in foregoing text may be implemented after the upright strip plate array has been stretched into a substantially planar strip plate array. Optionally, after formation of the substantially planar strip plate array, the flexible material layers 180 may be etched away so as to separate the respective strip plates, as shown in FIG. 14. Each of the separated strip plates forms an independent device 190. The flexible material layers 180 may be removed by means of processing technologies widely known in the semiconductor field and the field of micro mechanical system manufacturing.

As stated above, the structure with a plurality of connected strip plates is formed according to the method of the present invention. The strip plate to structure makes effective use of the thickness of the substrate, obtains more processable surface areas of wafers, and increases the utilization rate of wafers, on the premise that dimensions of whole wafers are not increased. Besides, the present invention proposes to form flexible material layers on the surfaces of the strip sheets, therefore, when the upright strip plate array is stretched to form a substantially planar strip plate array where a plurality of strip plates are connected, the neighboring strip plates can still be connected through the flexible material layers, even if the strip sheets ruptured because of their great brittleness, which therefore makes it easy to stretch a plurality of strip plates into a substantially planar strip plate array where the strip plates are distributed on a same plane; otherwise, if the neighboring strip plates break apart because of rupture of the strip sheets, it would be very hard to separate several strip plates that are still connected together or to stretch them to locate on a same plane. Accordingly, the method provided by the present invention improves efficiency and yield of device structure manufacturing.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a strip plate structure for semiconductor devices, which comprises following steps:

a) providing a substrate, which has a first surface and a second surface opposite to the first surface;
b) patterning the first surface and the second surface of the substrate;
c) forming at least two first trenches from the first surface of the substrate; and forming at least one second trench from the second surface of said substrate, wherein each of said second trench is located between two neighboring first trenches so as to form an upright strip plate array consisting of at least two strip plates and at least one strip sheet;
d) forming flexible material layers on at least a portion of the surfaces of the strip sheets and/or on at least a portion of the surfaces of the strip plates of the upright strip plate array; and
e) stretching the upright strip plate array to form a substantially planar strip plate array.

2. The method of claim 1, further comprising forming a device on the strip plates between the steps c) and d) or after the step e).

3. The method of claim 1, wherein at least a portion of the material of the strip sheets is the same as the material of the substrate.

4. The method of claim 1, wherein the flexible material layers at the step d) are formed by means of spraying, CVD, PVD, ALD, evaporating, spin coating or combinations thereof.

5. The method of claim 1, wherein the material of the flexible material layers is a material selected from a group consisting of metals, polymers, nano materials or combinations thereof.

6. The method of claim 5, wherein the metals include: Au, Al, Ag, Cu, Ti or combinations thereof.

7. The method of claim 5, wherein the polymers include: silica gel, polypropylene (PP), plexiglass, acrylic resin, acrylic acid, PMMA, polycast, transparent synthetic resin, resin glass, parylene, epoxy, polycarbonate (PC), silicone, polyurethane (PU), polyamide (PA), fluoropolymers, polyolefines (PE), collagen, chitin, chitosan, alginate fiber, polyvinyl pyrrolidone (PVP), PEG, PEO, PEO, PVA, PEG-PLA, PLA, PCL, poly amino acid, hydro gel, PDMS or combinations thereof.

8. The method of claim 5, wherein the nano materials include nanotube, graphene or combinations thereof.

9. The method of claim 1, wherein the thickness of the flexible material layers is 1~30 μm.

10. The method of claim 1, wherein the stretching step at the step e) comprises: stretching the upright strip plate array along the predetermined direction, such that the strip sheets connecting the neighboring strip plates are bent into arch shapes; the strip plate has a first surface and a second surface opposite to the first surface; the first surface and the second surface of the strip plate are perpendicular to the upright sidewalls of the arched strip sheets; the first surfaces and the second surfaces of the plurality of strip plates are located respectively on two planes parallel to each other.

11. The method of claim 1, wherein the stretching step at the step e) is operated at a temperature of 0° C.~300° C.

12. The method of claim 1, wherein at the step e), the neighboring bent strip sheets are bent towards opposite directions, and the strip sheets are bent to form arched grooves.

13. The method of claim 1, wherein a step of removing the flexible material further comes after the step e).

14. The method of claim 1, wherein the step a) further comprises: forming strip sheet layers on the upper surface and the lower surface of the substrate.

15. The method of claim 1, wherein following step further comes between the steps c) and d) or after the step d): separating the upright strip plate array from the substrate.

16. The method of claim 1, the material of the strip sheets is a material selected from a group consisting of: insulating layers, metal layers, polymers, semiconductor materials and combinations thereof.

17. The method of claim 13, wherein the step for forming the first trenches and the second trenches at the step c) comprises: etching a plurality of first trenches from the first surface of the substrate, which is stopped on the strip sheet layer at the second surface; and etching a plurality of second trenches from the second surface of the substrate, which is stopped on the strip sheet layer at the first surface.

18. The method of claim 1 wherein the step c) further comprises a step of forming interface layers at least on sidewalls of the first trenches and/or the second trenches.

19. The method of claim 17, wherein the depth of at least one of the first trenches and the second trenches is at least greater than the sum of the thickness of the strip plate and the spacing between the neighboring strip plates.

* * * * *